United States Patent [19]
Oh et al.

[11] Patent Number: 5,396,465
[45] Date of Patent: Mar. 7, 1995

[54] CIRCUIT FOR CONTROLLING ISOLATION TRANSISTORS IN A SEMICONDUCTOR MEMORY DEVICE

[75] Inventors: Seung-Cheol Oh, Suwon; Yong-Sik Seok, Songtan, both of Rep. of Korea

[73] Assignee: Samsung Electronics Co., Ltd., Suwon, Rep. of Korea

[21] Appl. No.: 156,779

[22] Filed: Nov. 24, 1993

[30] Foreign Application Priority Data

Nov. 24, 1992 [KR] Rep. of Korea ............... 22210/92

[51] Int. Cl.$^6$ .............................................. G11C 7/00
[52] U.S. Cl. .................................. 365/201; 365/205; 365/230.03; 365/230.08
[58] Field of Search ............... 365/201, 205, 207, 208, 365/230.03, 230.06, 230.08

[56] References Cited

U.S. PATENT DOCUMENTS

| | | | |
|---|---|---|---|
| 4,974,206 | 11/1990 | Iyama | 365/230.08 X |
| 5,016,224 | 5/1991 | Tanaka | 365/230.03 |
| 5,105,384 | 4/1992 | Noguchi | 365/230.08 X |
| 5,267,214 | 11/1993 | Fujishima | 365/230.03 |

Primary Examiner—Eugene R. LaRoche
Assistant Examiner—Son Mai
Attorney, Agent, or Firm—Charles R. Donohoe; Robert A. Westerlund, Jr.; Stephen R. Whitt

[57] ABSTRACT

A semiconductor memory device has adjacent memory arrays and isolation transistors disposed between a common bit sense amplifier and the memory arrays. An isolation control circuit according the present invention generates the power supply voltage Vcc (not the boost voltage Vpp) during the burn-in mode of operation, so that the gate oxide layer of the isolation transistors is prevented from being destroyed or deteriorated.

8 Claims, 5 Drawing Sheets

CIRCUIT FOR CONTROLLING ISOLATION TRANSISTORS IN A SEMICONDUCTOR MEMORY DEVICE

BACKGROUND OF THE INVENTION

This invention relates to a semiconductor memory device and more particularly to isolation transistors and a circuit for controlling the isolation transistors.

As semiconductor memory devices become more highly integrated, the structures of the memory arrays have been improved. Further, there have been proposed various techniques for arranging bit lines, such as an open bit line scheme, a folded bit line scheme and a shared bit line scheme. In general, the structures of the memory cell arrays are designed in consideration of the bit line arrangement.

Recently, to further increase integration density of memory chips, semiconductor memory is designed such that adjacent first and second memory cell array blocks share a common bit line sensing amplifier. In order to access data from a selected one out of the first and second memory cell array blocks, an unselected memory cell array block is temporarily electrically isolated from the common bit line sensing amplifier by controlling isolation transistors.

Korean patent application No. 1991-10195 filed by Samsung Electronics on Jun. 19, 1991 discloses how to improve operational characteristics of the sense amplifier in a semiconductor memory using isolation transistors. Moreover, Korean patent application No. 1991-20914 also filed by Samsung Electronics on Nov. 22, 1991, discloses improved isolation transistors. The device has advantages of high operation speed and low current consumptions. However, a problem occurs with this device during a burn-in mode. The high voltage continuously applied to the gates of the isolation transistors during the burn-in operation result in the destruction of the gate oxide layers of the isolation transistors.

It is most important in designing these isolation transistors to allow the isolation transistors to pass data output from a memory cell array to the sense amplifier or input/output lines without voltage drops. Destruction of the gate oxide layers prohibit this important design consideration from being met.

Referring to FIG. 1, neighboring memory cell array blocks, out of four memory cell array blocks MCAi, MCAj, MCAk and MCAl, share a sense amplifier disposed therebetween through isolation transistors IT-1–IT12 each controlled by isolation control signals ISOi, ISOj, ISOk and ISOl. It is noted from FIG. 1 that the isolation control signals ISOi, ISOj, ISOk and ISOl are generated from the isolation control signal generating circuits 10, 20, 30 and 40, each of which is controlled by the block selection address signals DRAi, DRAj, DRAk and DRAl that correspond to the memory cell array blocks MCAi, MCAj, MCAk and MCAl. The isolation control signals control the isolation transistors IT1–IT12 connected to the memory cell array blocks adjacent thereto.

FIG. 2, showing the operational timing diagram of the FIG. 1 circuit, will now be used to explain operation of the circuit. When none of memory cell array blocks are selected, the block selection address signals DRAi, DRAj, DRAk and DRAl are all at the logic "high" state of power supply voltage level (herein after referred to as "Vcc level"). Then, the isolation control signals ISOi, ISOj, ISOk and ISOl all become the logic "high" state of the boost voltage level (hereinafter referred to as "Vpp level", so that the isolation transistors IT1–IT12 are provided with the boost voltage Vpp at the gates thereof and are all turned on. Here, the boost voltage Vpp is higher than the externally power supply voltage Vcc. If the memory cell array block MCAj is selected, the block selection address signal DRAj for designating the block MCAj changes to the logic "low" state. Then, NMOS transistors 2 and 4 in the isolation control signal generating circuit 20 are respectively turned off and turned on, so that the voltage at a node 6 is discharged from the boost voltage Vpp to the ground voltage Vss. Thus, the isolation control signal ISOj becomes the logic "low" state. Therefore, the isolation transistors IT1, IT2, IT7 and IT8 whose gates are commonly connected to the isolation control signal ISOj are turned off and the other isolation transistors IT3, IT4, IT5, IT6, IT9, IT10, IT11 and IT12 are all turned on. As a result, the memory cell array blocks MCAi and MCAk are isolated from the sense amplifiers. In this way, the data stored in the memory cell array block MCAj can be sensed by the sense amplifiers.

In the conventional device, the isolation control signals ISOi, ISOj, ISOk and ISOl fully swing between the boost voltage Vpp and the ground voltage Vss, resulting in large current consumptions and operational speed loss. Such drawbacks become more serious when the conventional device is applied to the high density semiconductor memory having small sized transistors and using low operational voltage. Furthermore, since the isolation transistors IT9, IT10, IT11 and IT12 of the unselected memory cell array block MCAl are provided with the boost voltage Vpp at the gates thereof, the isolation transistors are under the stress of high voltage. In particular, when the device operates in a burn-in mode, where the high voltage such as the boost voltage Vpp is applied externally to check the performance of the memory chip under the high voltage stress, the isolation transistors will be under the large stress of the high voltage, causing the destruction of the gate oxide layers of the isolation transistors.

FIG. 3, illustrates another known device disclosed in "1992 Symposium on VLSI Circuits Digest of Technical Papers, pp. 106–107, entitled "Application of High-Voltage Pumped Supply for Low-Power DRAM" by R. C. Foss. In this device, the isolation transistors are provided with the power supply voltage VDD during a normal state, and with the boost voltage Vpp during a data access cycle. However, during the burn-in mode, the isolation transistors will still be under the stress of the high boost voltage, causing the destruction or deterioration of the gate oxide layers of the isolation transistors.

SUMMARY OF THE INVENTION

It is therefore an object of the present invention to provide a circuit for protecting isolation transistors during a burn-in mode of operation.

The present invention, a semiconductor memory device control circuit, is used in a semiconductor memory having adjacent memory arrays and isolation transistors disposed between a common bit sense amplifier and the memory arrays. An isolation control circuit generates the power supply voltage Vcc (not the boost voltage Vpp) during the burn-in mode of operation, so that the gate oxide layer of the isolation transistor is prevented from being destroyed or deteriorated.

BRIEF DESCRIPTION OF THE DRAWINGS ACCOMPANYING

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 1:
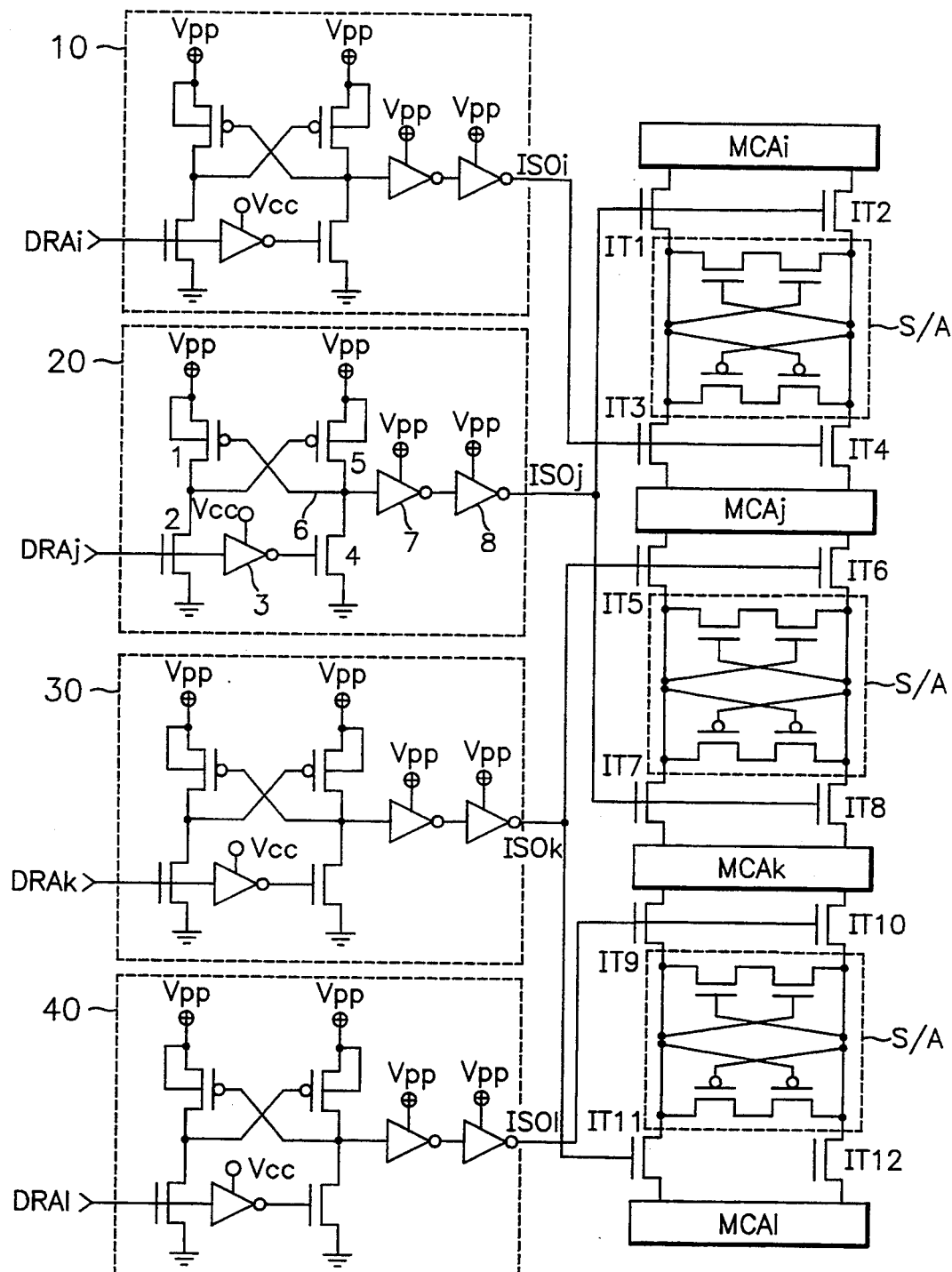
FIG. 1 shows a conventional circuit for controlling the isolation transistors.
Figure 2:
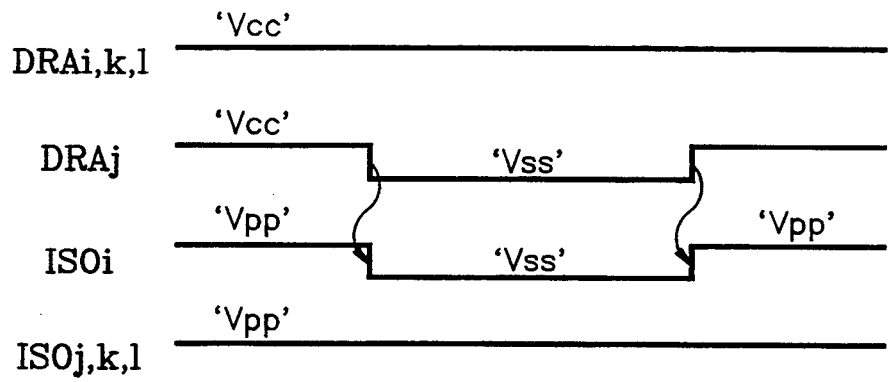
FIG. 2 shows a timing diagram of the circuit of FIG. 1.
Figure 3:
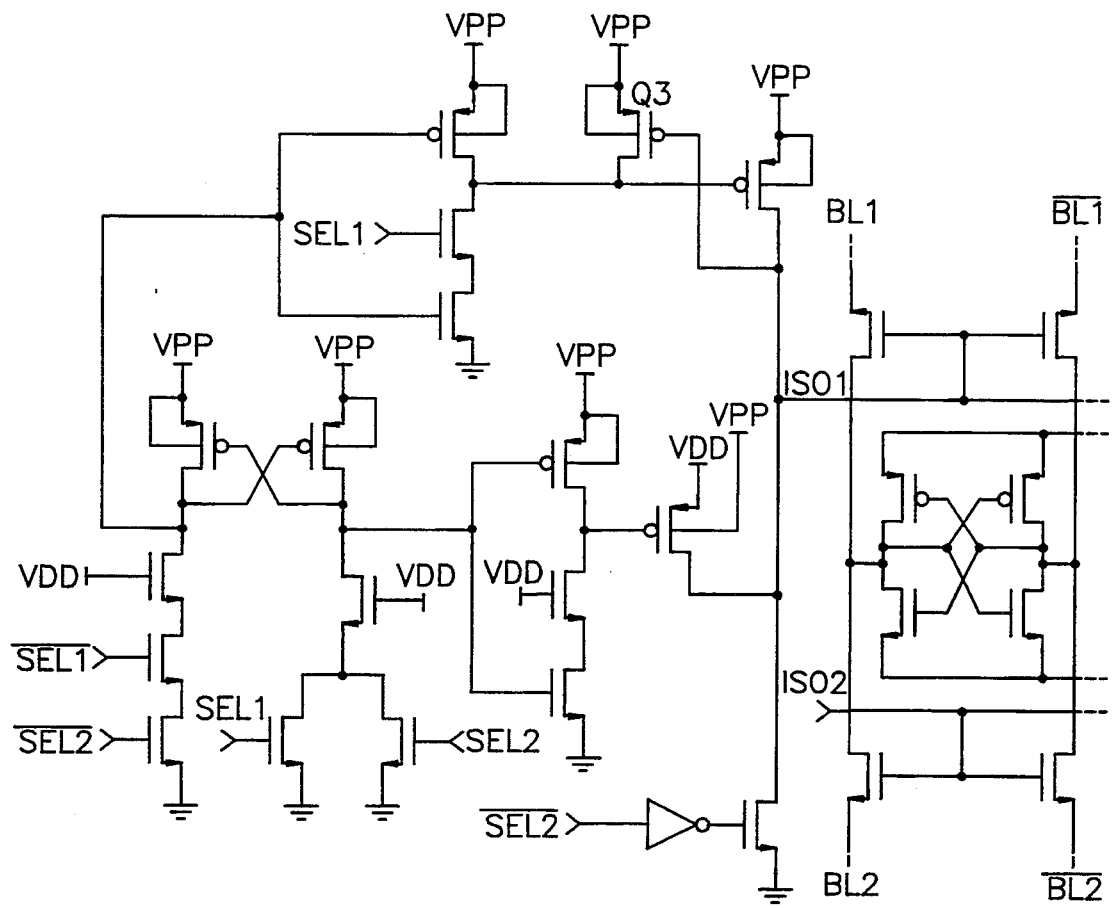
FIG. 3 shows another conventional circuit for controlling the isolation transistors.
Figure 4:
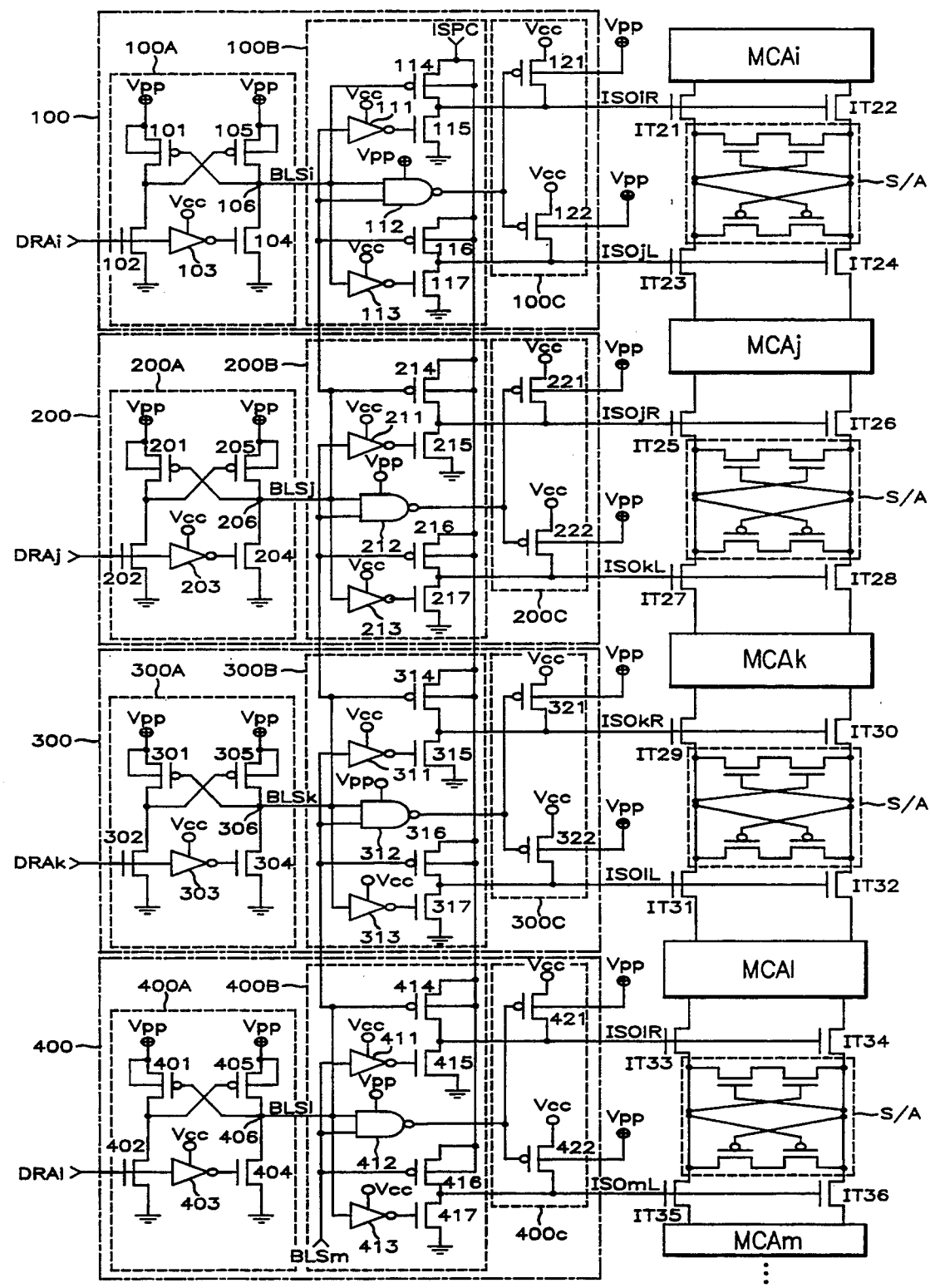
FIG. 4 shows a circuit for controlling the isolation transistors according to the present invention.

Referring to FIG. 4, illustrated is a semiconductor memory employing a circuit for controlling the isolation transistors according to the present invention. In the drawing, isolation control circuits 100, 200, 300 and 400 having the same structure are provided. The isolation control circuit 100 includes a level conversion circuit 100A, a driving circuit 100B and a pull-up circuit 100C.

The level conversion circuit 100A converts the level of an address signal input DRAi of Vcc level, to generate a block selection signal BLSi of Vpp level.

The driving circuit 100B connected to the level conversion circuit 100A includes an inverter 111 for receiving a block selection signal BLSj from the isolation circuit 200. A NAND gate 112 receives the block selection signals BLSi and BLSj. An inverter 113 receives the block selection signal BLSi and a pull-up transistor 114 has a channel connected to an isolation power control signal ISPC and a gate coupled to the block selection signal BLSi. The isolation power control signal ISPC determines the selection of the power supply voltage Vcc and the boost voltage Vpp. A pull-down transistor 115, connected in series with the pull-up transistor 114, receives the output of the inverter 111. A pull-up transistor 116, whose channel is connected to the isolation power control signal ISPC, receives the block selection signal BLSj. A pull-down transistor 117, connected in series with the pull-up transistor 116, receives the output of the inverter 113.

The pull-up circuit 100C, connected to the output of the driving circuit 100B, includes a pull-up transistor 121 for pulling-up to the power supply voltage Vcc of an isolation control signal ISOiR in response to the output of the NAND gate 112 and a pull-up transistor 122 for pulling-up to the power supply voltage Vcc an isolation control signal ISOiL in response to the output of the NAND gate 112. The other isolation control circuits 200, 300 and 400 have the same structure, as shown in the drawing.

Figure 5:
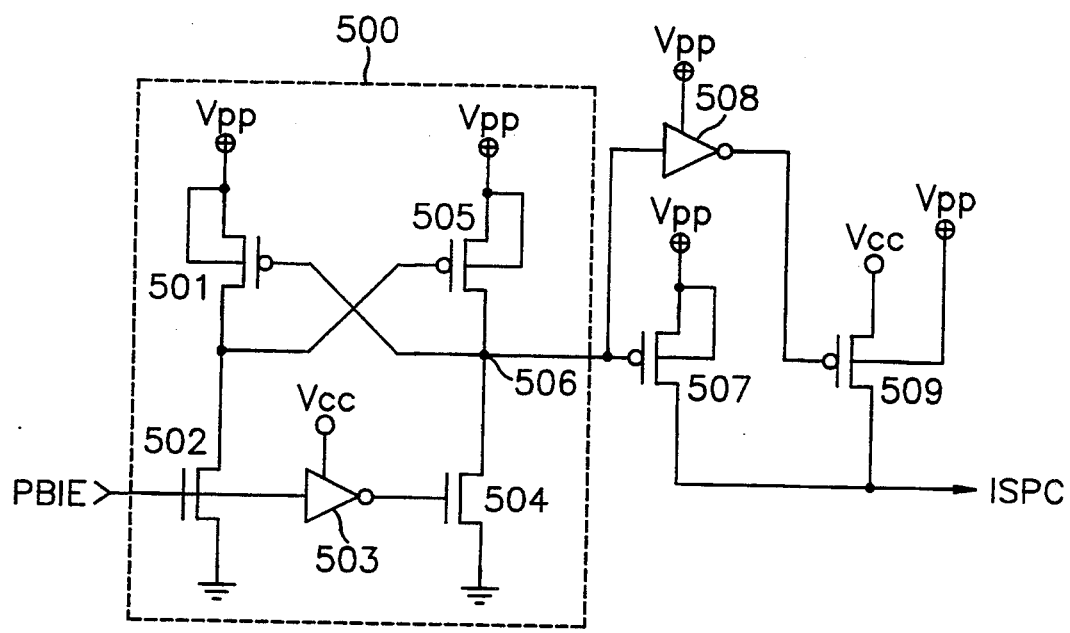
FIG. 5 shows a circuit for generating an isolation power control signal ISPC according to the present invention.

Referring to FIG. 5, an ISPC signal generation circuit for generating the isolation power control signal ISPC according to the present invention is illustrated. The ISPC signal generation circuit includes a level conversion circuit 500 for receiving the burn-in mode enable signal PBIE during the burn-in mode of operation. A first output circuit 507 pulls the isolation power control signal ISPC to the boost voltage Vpp in response to the output of the level conversion circuit 500. An inverter 508 inverts the output of the level conversion circuit 500 and a second output circuit 509 pulls the isolation power control signal ISPC to the power supply voltage Vcc in response to the output of the inverter 508. The ISPC signal generation circuit generates the power supply voltage Vcc by the second output circuit 509 during the burn-in mode of operation and the boost voltage Vpp by the first output circuit 507 during a normal mode of operation.

Figures 6A, 6B:
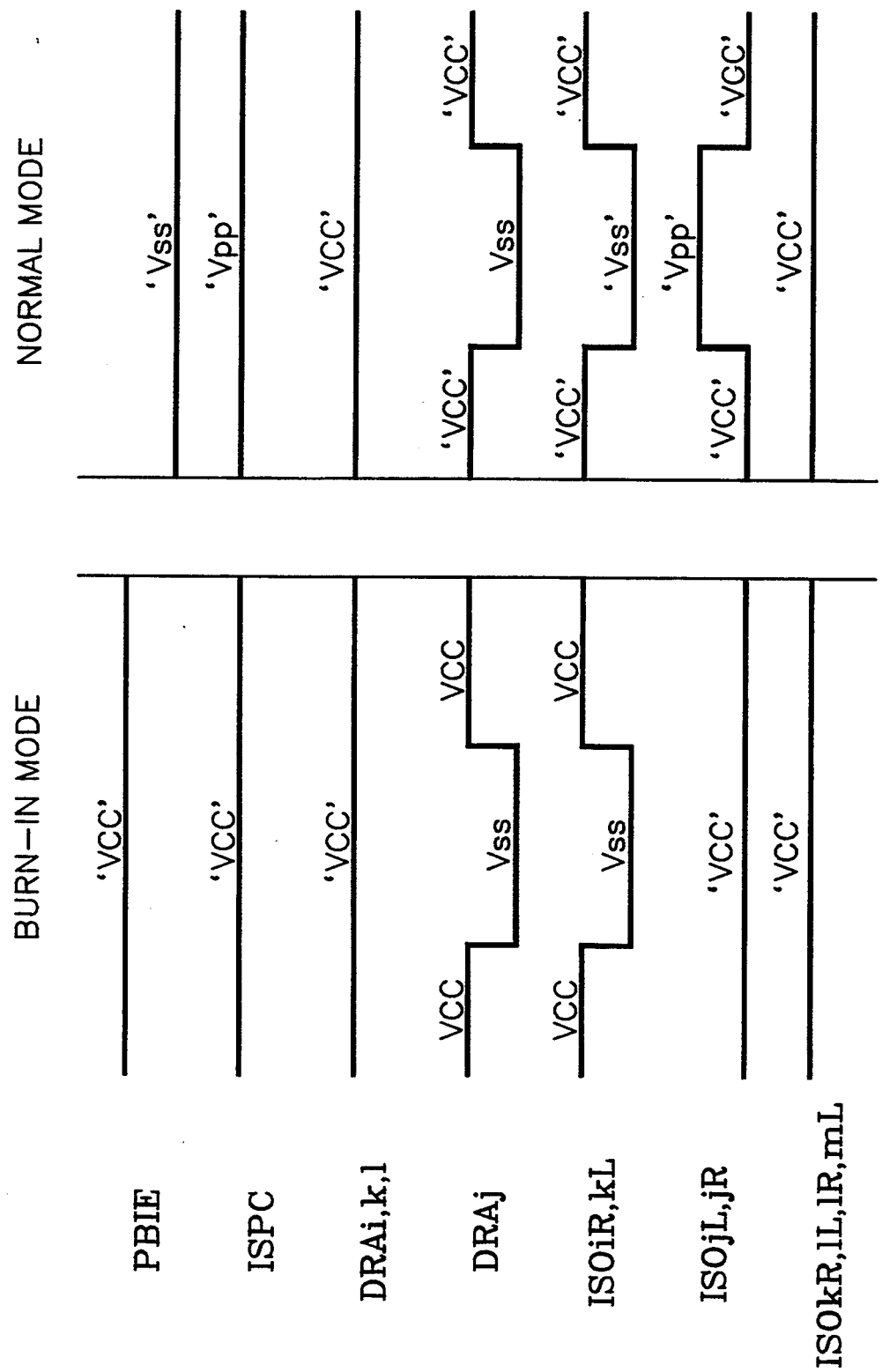
FIG. 6A shows a timing diagram of the circuit of FIG. 4 when operating in a burn-in mode.
FIG. 6B shows a timing diagram of the circuit of FIG. 4 when operating in a normal mode.

With reference to FIGS. 6A and 6B, which illustrate the operational timing diagrams of FIGS. 4 and 5, operation of the present invention will be described in detail hereinbelow.

When the circuit of FIG. 4 operates in the burn-in mode, a logic "high" burn-in mode enable signal PBIE is applied to the level conversion circuit 500 of FIG. 5 and thus, the level of the isolation power control signal ISPC becomes the power supply voltage Vcc by the second output circuit 509. If the block selection address signals DRAi, DRAj, DRAk and DRAl obtained by decoding row address signals are all at the logic "high" state, the block selection signals BLSi, BLSj, BLSk and BLSl are also at the logic "high" state of Vpp level. Therefore, the ISPC signal is disconnected from the isolation control signals ISOiR, ISOiL, ISOjR, ISOjL, ISOkR, ISOkL, ISOlR and ISOlL. At this moment, since the AND gates 112, 212, 312 and 412 all generate the logic "low" state, the pull-up transistors 121, 122, 221, 222, 321, 322, 421 and 422 are all turned on, and as a result, the isolation control signals ISOiR, ISOiL, ISOjR, ISOjL, ISOkR ISOkL, ISOlR and ISOlL are pulled to the power supply voltage Vcc, so that the isolation transistors IT21–IT36 are all provided with the power supply voltage Vcc at the gates thereof.

If a memory cell array block MCAj, for example, is selected, the block selection address signal DRAj goes to the logic "low" state while the block selection address signals DRAi, DRAk and DRAl are held at the logic "high" state. Then, the block selection signal BLSj becomes the logic "low" state while the other block selection signals BLSi, BLSk and BLSl remain at the logic "high" state. Then, the pull-up transistor 214 is turned on and the isolation power control signal ISPC is connected to the isolation control signal ISOjR. Further, since the NAND gates 112 and 212 generate the logic "high" state, the pull-up transistors 121, 122, 221 and 222 are all turned off. Also, the inverters 111 and 213 generate the logic "high" state to turn on the pull-down transistors 115 and 217, thereby changing the logic state of the isolation control signals ISOiR and ISOkL to the logic "low" state. Thus, since the isolation transistors IT21, IT22, IT27 and IT28 are turned off to allow the sense amplifier to sense data from the memory cell array block MCAj. At this moment, since the block selection signal BLSj is at the logic "low" state, the pull-up transistors 116 and 214 are turned on and the isolation signals ISOjL and ISOjR hold at the logic "high" state of Vcc level as shown in FIG. 6A.

It is therefore noted from the above description that since the selected isolation transistors are provided with the power supply voltage Vcc (not the boost voltage Vpp) at the gates thereof during the burn-in mode, the gate layers of the isolation transistors are prevented from being destroyed.

When the circuit operates in the normal mode, a logic "low" burn-in mode enable signal PBIE is applied to the level conversion circuit 500 of FIG. 5 and thus, the level of the isolation power control signal ISPC becomes the boost voltage Vpp by the first output circuit 507. The operation of the circuit of FIG. 4 is the same as that in the burn-in mode, except that the isolation power control signal ISPC is of the boost voltage Vpp. Accordingly, if the memory cell array block MCAj, for example, is selected, the isolation control signals ISOiR and ISOkL are at the logic "low" state and thus, the isolation transistors IT21, IT22, IT27 and IT28 are turned off to isolate the memory cell array blocks MCAi and MCAk from the sense amplifiers. Further, the isolation control signals ISOjL and ISOjR are all at the logic "high" state of Vpp level as shown in FIG. 6B so that the isolation transistors IT23, IT24, IT25 and IT26 are strongly turned on to increase the data sensing speed.

Figure 7:
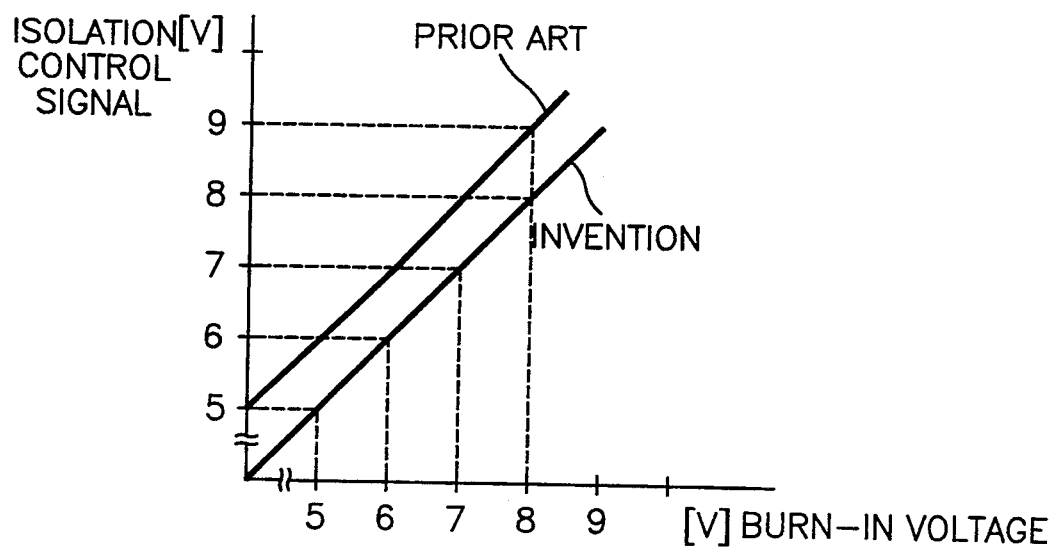
FIG. 7 shows a characteristic diagram of the present invention compared to the conventional device.

FIG. 7 shows the characteristic diagram of the present invention compared to the conventional device. It can be appreciated from the diagram that the burn-in mode may be setup at a lower level of the isolation control signals.

While the invention has been described in connection with what is presently considered to be the most practical and preferred embodiments, the invention is not limited to the disclosed embodiment but, on the contrary, is intended to cover various modifications and equivalents included within the spirit and scope of the following claims.

What is claimed is:

1. An isolation control circuit for a semiconductor memory device including a bit line sense amplifier, first and second adjacent memory cell arrays that share the bit line sense amplifier, and isolation transistors disposed between the bit line sense amplifier and the first memory cell array and between the bit line sense amplifier and the second memory cell array, comprising:
    a level conversion circuit that receives an address signal and generates a block selection signal;
    a driving circuit that receives said block selection signal and which selectively controls applications of a first voltage and a second boost voltage to said isolation transistors; and
    a burn-in control circuit connected to said driving circuit for preventing said second boost voltage from being applied by said driving circuit to said isolation transistors during a burn-in test.

2. An isolation control circuit according to claim 1, wherein said first voltage is externally supplied power supply voltage and said second boost voltage has a higher voltage than said externally supplied power supply voltage.

3. An isolation control circuit according to claim 2, wherein said level conversion circuit includes pull-up transistors.

4. An isolation control circuit according to claim 1, wherein said level conversion circuit includes pull-up transistors.

5. An isolation control circuit for a semiconductor memory device including a bit line sense amplifier, first and second adjacent memory cell arrays that share the bit line sense amplifier, and isolation transistors disposed between said bit line sense amplifier and said first memory cell array and between said bit line sense amplifier and said second memory cell array, comprising:
    level conversion means receiving an address signal, for generating a block selection signal;
    driving means receiving said block selection signal, for selectively controlling applications of a first voltage and a second boost voltage to said isolation transistors; and
    burn-in control means connected to said driving means, for preventing said second boost voltage from being applied by said driving means to said isolation transistors during a burn-in test.

6. An isolation control circuit according to claim 5, wherein said first voltage is externally supplied power supply voltage and said second boost voltage has a higher voltage than said externally supplied power supply voltage.

7. An isolation control circuit according to claim 6, wherein said level conversion means includes pull-up transistors.

8. An isolation control circuit according to claim 5, wherein said level conversion means includes pull-up transistors.

* * * * *